United States Patent [19]
Horn

[11] 4,176,321
[45] Nov. 27, 1979

[54] DELTA MODULATION DETECTOR
[75] Inventor: Paul H. Horn, Franklin Park, Ill.
[73] Assignee: Motorola, Inc., Schaumburg, Ill.
[21] Appl. No.: 830,256
[22] Filed: Sep. 2, 1977
[51] Int. Cl.$^2$ .......................... H04B 1/10; H04B 1/16; H04N 7/16
[52] U.S. Cl. ................................. 325/325; 179/1.5 S; 325/323; 358/114
[58] Field of Search .......................... 179/1.5 E, 1.5 S; 358/114, 117, 121; 325/38 B, 323, 325, 32, 33; 235/92 TF, 29 PB

[56] References Cited
U.S. PATENT DOCUMENTS

| | | | |
|---|---|---|---|
| 3,852,671 | 12/1974 | Risley | 325/325 |
| 4,045,814 | 8/1977 | Hartung et al. | 358/121 |
| 4,087,753 | 5/1978 | Paul | 325/325 |

Primary Examiner—Robert L. Richardson
Assistant Examiner—Joseph A. Orsino, Jr.
Attorney, Agent, or Firm—Sang Ki Lee; James W. Gillman

[57] ABSTRACT

A detector for detecting a delta modulated signal includes a timing circuit, a counter and a decoder arranged to detect a delta modulated signal in electrically noisy environment. The timing circuit is used to provide a timing signal of a predetermined time interval over which the counter counts the transitions present in the delta modulated signal. The counter is used for counting the digital bit occurrences of the delta modulated signal within the predetermined time interval. The decoder responds to the timing signal and receives the count signals from the counter and provides a binary signal of first state when the count signal indicates the number of bit occurrences of the delta modulated signal is above a predetermined high level of count or below a predetermined number of low count and provides a binary signal of a second state when the count signal indicates that the number of the digital bit occurrences occur between the predetermined high level of count and the predetermined low level of count. The detector is further provided with a latch circuit which responds to the output of the decoder and a code detect signal representing detection of a predetermined code signal in delta modulated signal. The latch circuit is used to provide an output signal in response to the binary signal of the first state from the decoder and the code detect signal to signify proper reception of delta modulated signal. The above described detector may be advantageously used in a receiver for receiving a scrambled or unscrambled incoming delta modulated digital data signal.

5 Claims, 5 Drawing Figures

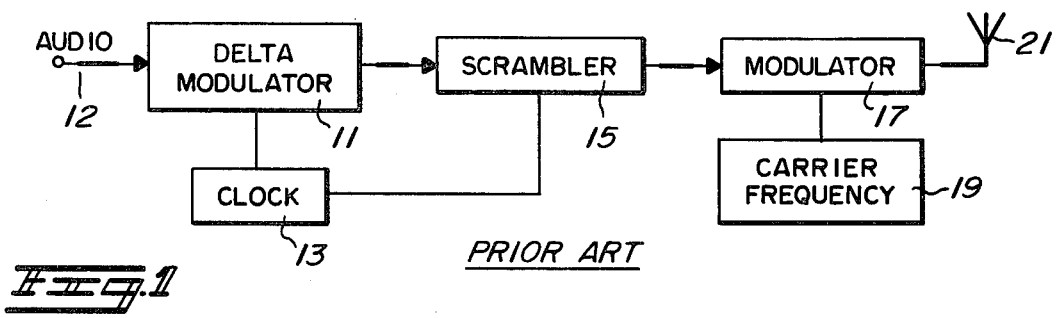
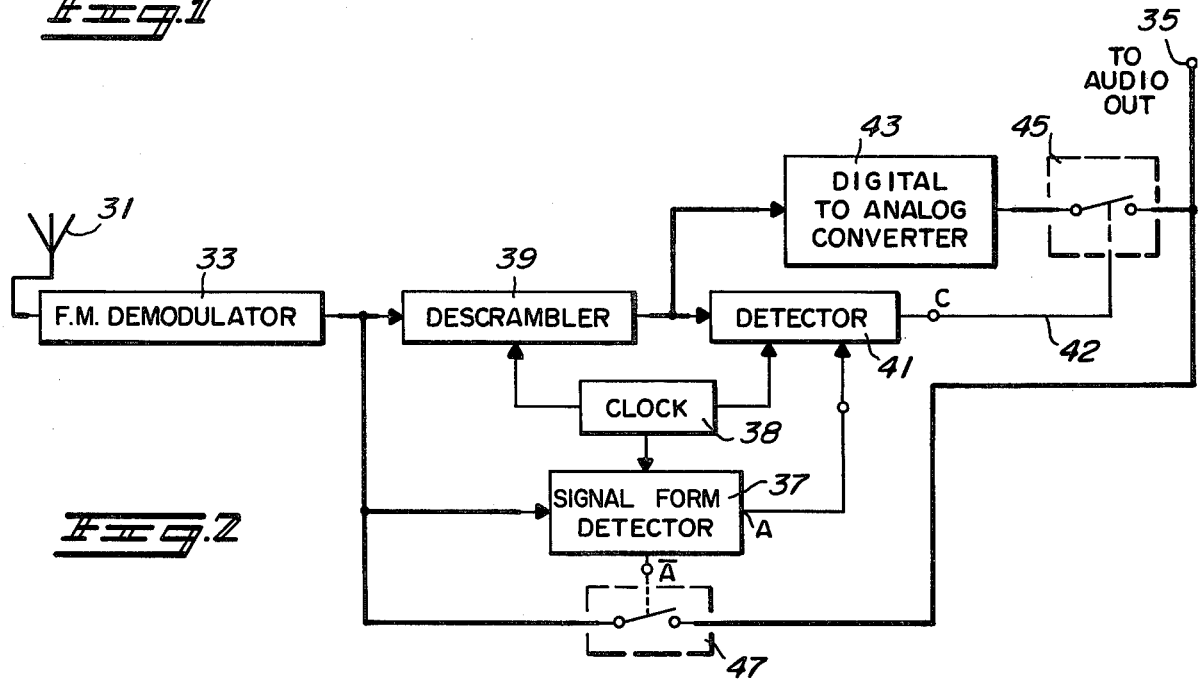
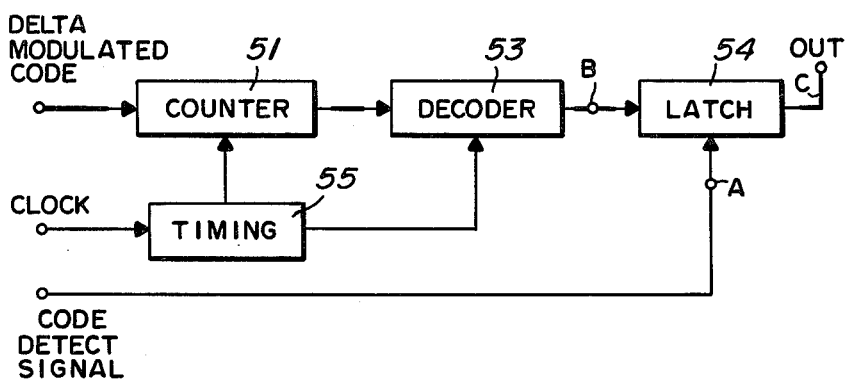
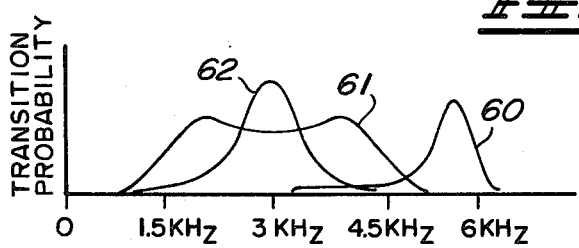

DELTA MODULATION DETECTOR

FIELD OF THE INVENTION

This invention relates to an improved delta modulated digital signal detector and use of such a detector in a receiver adapted to receive either delta modulated digital and analog signal.

BACKGROUND OF THE INVENTION

Increasingly, in recent years communications need is met by digital transmission. This is manifested in the form of delta modulation of input analog signal into a digital form and then the signal in the digital form is frequency modulated and transmitted. At the receiving end the frequency modulated received signal is frequency demodulated and the frequency demodulated signal is received in a proper manner. If the received signal is in the form of delta modulated signal, the delta modulated signal is then converted into analog signal by use of a digital to analog converter.

It is generally known to provide a receiver that can receive demodulated signal, that is, a demodulated signal in the analog form or in the digital form. If it is in the digital form, the digital signal is first converted into an analog signal by a digital to analog converter and then the analog signal is utilized to drive the output means which may be in the form of audio output.

Typically, the detector for detecting the delta modulated signal according to prior art includes means for detecting a predetermined code signal to sense the presence of an incoming delta modulated signal. Upon detection of such a signal, the incoming delta modulated signal is converted into analog signal and received.

Such a prior art detector is often susceptible to failure in that it is not capable of discriminating and detecting incoming data in the presence of high level of noise and tends to detect incoming noise signal as if it is a valid digital data. Various attempts have been made to overcome such a shortcoming and usually the attempts have been made in the form of rather elaborate filtering circuit arrangement to filter out the noise content of the incoming digital data for avoiding false detection. It has been found, however, that none of the prior art detectors designed to detect delta modulated signal in a noisy environment is completely satisfactory and require still further improvements.

SUMMARY OF THE INVENTION

It is an object of the present invention to overcome the aforementioned and other shortcomings found in the prior art delta modulated signal detector.

It is yet another object of the present invention to provide an improved delta modulated signal detector.

It is yet another object of the present invention to utilize, in an advantageous manner, an inventive delta modulated signal detector in a receiver.

The aforegoing and other objects of the present invention is obtained by providing a detector for detecting a delta modulated signal that includes a timing signal source, a counter, a decoder and a latch circuit operatively adapted to detect the presence of a delta modulated signal in a noisy environment in such a way that false detection of incoming delta modulated signal due to noise is virtually eliminated. More specifically, in the detector, the timing signal source is used to provide a timing signal of a predetermined time interval. The counter is used to respond to this timing signal and provides a count signal indicative of the count of the digital bit occurrences of the delta modulated signal within the predetermined time interval. The detector is used to respond to the timing signal and receive the count signal from the counter. The decoder provides a binary signal of a first state when the count signal indicates the number of bit occurrences of the delta modulated signal above a predetermined high level of count or below a predetermined number of a low level of count and provide a binary signal of a second state when the count signal falls in between the predetermined high level and low level count. If either of the condition is met, that is, if the count exceeds the predetermined high level or falls below the predetermined low level then the decoder is used to provide an other signal indicating proper reception of delta modulated signal. The output of the decoder is used then as a latch signal for operating a latch circuit to permit reception of the incoming delta modulated signal.

In accordance with still another aspect of the present invention, the afore described delta modulated signal detector can be utilized in a receiver in an advantageous manner to permit the receiver to receive whether it is frequency demodulated analog signal or frequency demodulated descrambled digital signal.

The aforegoing and other advantageous features of the present invention will become more clearly understood from the following detailed description of illustrative embodiments in conjunction with the accompanying drawings.

BRIEF DESCRIPTION OF THE DRAWINGS

FIG. 1 illustrates a prior art transmitter that provides delta modulated signal.

FIG. 2 shows, in a block diagram form, a receiver that illustrates an inventive use of the delta modulated signal detector of the present invention.

FIG. 3 illustrates, in a block diagram form, the delta modulated signal detector of the present invention.

FIG. 4 illustrates probability curves of counts corresponding to the frequency distribution of the delta modulated signal in the audio band.

FIG. 5 illustrates a truth table helpful in the understanding of the operation of the delta modulated signal detector of the present invention.

DETAILED DESCRIPTION

Referring to FIG. 1, there is shown a transmitter that provides a delta modulated signal. Such a transmitter may include a delta modulator 11 of a conventional design which modulates incoming audio applied to its input 12 in response to a clock signal from a clock source 13. The delta modulated signal may be applied to a scrambler 15. The scrambler 15 receives the delta modulated digital signal from the delta modulator 11 in response to the clock pulses from the clock source 13 and provides a delta modulated scrambled digital signal to the modulator 17. In a typical situation, the modulator 17 modulates the output of the scrambler into a frequency modulated signal using a carrier frequency from a carrier frequency source 19. The frequency modulated signal is then transmitted via a suitable antenna 21. The modulation of the input audio signal into delta modulated scrambler 15 and then into FM modulated signal and then transmission via a antenna as described above is generally known.

While the transmitter described above is shown to include use of a scrambler, such a use is optional. Where security of the transmitted signal is necessary the scrambler is generally used. However, in many applications, where security of the information is not necessary, the scrambler is not used.

FIG. 2 illustrates a receiver of the present invention. It includes a receiving antenna 31 which receives the frequency modulated signal from the transmitter. The received signal is frequency demodulated by a frequency demodulator 33 in a conventional manner. If the incoming signal is merely frequency modulated signal, upon demodulation by an F.M. demodulator 33, the output thereof is applied to a suitable audio output means 35. Typically the audio means may be a speaker that provides audio output to the listener.

In accordance with the present invention, the receiver is arranged not only to receive the FM modulated analog signal but also to receive FM modulated, delta modulated signal. As illustrated in FIG. 2 the receiver includes a signal form detector 37 of a conventional design, such as that described in U.S. Pat. No. 3,995,225 to Paul Henry Horn that determines whether or not the incoming signal is analog or digital, a clock signal source 38, a descrambler 39, a delta modulated signal detector 41, a digital to analog converter 43, switching circuitry 45 and 47 operatively connected to provide the detection function, as will be described hereinbelow. But before the receiver of the present invention is described further in detail, first the delta modulated signal detector of the present invention will be described with reference to FIG. 3.

FIG. 3 illustrates the present inventive delta modulated signal detector in a functional block diagram form. As shown in FIG. 3, delta modulated signal detector includes a counter 51, a decoder 53, a latch 54, a timing circuit 55 operatively connected in the manner shown. The counter 51 receives a delta modulated signal which is in the form of train of square wave pulses wherein the train of square wave transitions represent the incremental delta changes in the analog signal. The delta modulation may take place at a predetermined frequency sampling rate such as twice the bandwidth of the analog signal. For example, in the case of voice signal the sampling frequency at which the input analog voice signal is delta modulated is set at 6 kHz or twice the 3 kHz bandwith of the voice signal.

The delta modulated signal that has been transmitted and received has different energy spectrum characteristics as shown in FIG. 4 which illustrates the probability of counts corresponding to the frequency distribution of the delta modulated signals. It has been found that, in the absence of voice signal, the delta modulated signal has a rather high level of energy that is content, at above 4.5 kHz. Theoretically, the spectrum would appear at 6 kHz with clock frequency of 12 kHz. In real situations, however, because of the noise, the spectrum shifts downward as illustrated in wave form 60. With voice signal present the spectrum tends to spreadout between 1.5 and 4.5 kHz as illustrated in wave form 61. However, as the noise level increases, it is found that the energy level tends to concentrate in the center frequency around 3 kHz while the energy at the lower and upper levels tends to decrease as illustrated in wave form 62. Received delta modulated signals generally tend to have some degree of noise, so it is important to provide a detector that can detect presence of incoming digital data in the delta modulated signal in the presence of some level of noise and the detector must be able to discriminate between the noise and the signal. However, because of the fact that the noise is well embedded in the whole spectrum of signal band of the delta modulated signal, the discrimination is found to be very difficult. Various attempts have been made according to prior art to design a sophisticated filter circuitry to filter out the noise. However, none has been found to be very satisfactory. According to yet another prior art, active filters have been utilized to eliminate the noise but generally they tend to have low sensitivity and, moreover, require change in the filter, if new clock frequency is utilized in the detector. Further attempt to refine the sensitivity of the delta demodulator detector entailed use of more complex and rather expensive bandpass active filter.

In accordance with the present invention, the aforementioned shortcomings associated with the use of filters are avoided. This is rendered possible by use of a network designed to provide intended functions on a statistical basis. This is accomplished by utilizing a timing signal means that provides a timing signal with a predetermined time period or interval in response to a clock signal pulse train. Such a timing signal is then applied to the counter 51. This is shown in FIG. 3 in the form of timing circuitry 55 which applies a timing signal the predetermined time period to the counter 51. In response, counter 51 will count the bit occurrences of the delta modulated signal applied to the input thereof within the given time interval. The counter is a conventional design that is adapted to count positive transitions of the incoming delta modulated digital signal which is in the form of square wave pulse train within a given time period. The output of the counter indicates the frequency distribution of the delta modulated signal in the form of counts of the transitions of the square wave pulse train, and thus the number of bit occurrences of the pulses in the delta modulated signal.

Statistically, it is found that if the incoming delta modulated signal does not contain a voice signal, the count signal will indicate a substantially high level of count of the transitions, somewhere around 4.5 kHz or higher as illustrated in wave form 60. But if the signal being received is a voice or low frequency analog signal that has been delta modulated, then the count signal is by and large distributed between 1.5 kHz and 4.5 kHz with a quite bit of energy present below 1.5 kHz and above 4.5 kHz as illustrated in wave form 61. It has been found statistically also that, if the incoming signal is a delta modulated signal that contains a high level of noise, the counter output energy level is found in the intermediate band around 3 kHz between the low frequency 1.5 kHz and upper frequency 4.5 kHz, as illustrated in wave form 62.

These statistical distribution of energy spectrum in the received is advantageously utilized, according to the present invention, to discriminate noise from signal in the receiver. Thus, if the energy level in terms of the count signal from the counter 51 is found to exist above the predetermined high level spectrum of 4.5 kHz or above, or in a predetermined low level spectrum of 1.5 kHz or below, then the incoming signal is deemed noise free and is received as delta modulated digital signal even though it may contain some level of noise. On the other hand, if the noise level is so significant that the energy level spectrum is entirely between the upper and lower predetermined spectrum, as evidenced by the count signal, then the incoming signal is deemed to be either noise or data heavily laiden with noise and not received.

The foregoing principle of the present invention is embodied in a detector shown in FIG. 3. The detector includes the decoder circuit 53 of a conventional type which carries out the aforementioned logical decoding function on the counter output signal from the counter 51 and provides a binary signal of a first or a second state, for example, logical 1 or logical 0. Logical 1 is provided if the count signal from the counter indicates presence of energy level above the predetermined upper level or below the predetermined lower level to signify that the incoming signal is either the carrier signal or the delta modulated signal with an audio that has been delta modulated. The decoder provides the binary signal of the opposite or logical 0 signal in response to the counter signal that indicates that the incoming signal is highly noisy. This condition is indicated by the energy level of the incoming delta modulated signal being in the midband between the predetermined upper level and the predetermined lower level frequency.

Latch circuit 54 is of a conventional design and performs the following functions: a certain code may be transmitted by the transmitter designed to signify the fact that, the incoming signal is a scrambled delta modulated digital signal. Upon detection of such a code, the code signal is applied to the latch at the input designated A. Such a code signal is in the form of signal of either logical 0 or logical 1 depending upon the absence or the presence of the detected signal. Now the latch performs a logical function in response to the code to the detect signal and the signal in the form of binary 1 or 0 from the output of decoder 53 designated B. The latch is designed to operate as a logical circuit element that operates in the manner shown in a truth table FIG. 5.

Initially, when no signal is present the code detect signal status, A, and the output of the decoder, B, signify logical 0, as indicated in Status State I. This is the case when the decoder is yet to receive any incoming delta modulated digital signal. At this stage, the output of the latch C is logical 0 signifying that the delta detector has not yet detected any delta modulated digital signal. Decoder 53 presents incoming delta modulated digital signal, in the form or logical 1 or logical 0 to input B of latch 54 depending upon whether or not the incoming signal is highly noisy. Suppose at that point the code signal is detected. This is presented to input A of latch 54 as logical 1. But suppose the noise content is high in the incoming signal, as indicated by the count that represent the predetermined band defined by the predetermined upper level and predetermined lower level or some other malfunction; this will cause the decoder to continue to provide logical 0 to input B of latch 54. Latch 54 will continue to provide logical 0 output which signifies that incoming delta modulated signal is still unacceptable because of high noise level. This status state is represented by the Status State II.

Now suppose incoming signal is a delta modulated signal that is not contaminated by noise or has a level of noise but not serious as determined according to the statistical nature, i.e., incoming signal has energy spectrum above 4.5 kHz or below 1.5 kHz then the decoder provides logical 1, signifying a proper reception of the delta modulated signal, without undue interference of the noise, this logical 1 signal is applied to input B of the latch 54. In turn, the latch 54 changes its output to logical 1. This is illustrated in Status State III in FIG. 5.

As the incoming delta modulated signal is continuously received, it is advantageous to permit the latch output to remain logical 1, as illustrated in Status State IV even though the output of the decoder goes to logical 0 signifying that the signal is now getting a high level of noise, so long as the code detect signal from code detector indicates reception of delta modulated signal. This permits a built-in latitude in the delta modulated code detector to continue to receive the incoming delta modulated signal, once the reception of the delta modulated signal begins to take place. However, once the code detect signal signifies termination of the incoming signal delta modulated signal in the form of change in its binary signal status of logical 1 to logical 0 as shown in Status State V, then the latch signal changes its output to logical 0. This signifies termination of the incoming delta modulated signal.

Advantageously, the aforedescribed delta modulator may be utilized in a receiver designed to receive a delta modulated signal that may have been scrambled at the transmitter and therefore that may have to be descrambled at the receiver as illustrated in FIG. 2. It is noted here that the use of delta modulated signal detector, such as that shown in FIG. 3, and described hereinabove, can be just as well utilized in detecting delta modulated signal that has not been subjected to the scrambling process. This simply means that the scrambler 15 and the descrambler 39 shown in FIGS. 1 and 2 may be simply omitted. The use of the delta modulated signal detector shown in FIG. 3 is represented in the receiver shown in FIG. 2 is the form of detector 41.

The delta modulated signal detector of the present invention is usable in a receiver designed to detect delta modulated digital signal as well as analog signal, as will be evident from the following description. As illustrated in FIG. 2, suppose the incoming signal is in the form of analog signal that has been freuency modulated, the antenna 31 will receive such a signal and will be frequency demodulated by the F. M. demodulator 33. The output of demodulator 33 at this point is in the form of analog signal that can be applied to the audio output means 35 via a switch 47. Suppose, on the other hand, the incoming signal is in the form of delta modulated digital signal that has been scrambled. This will be received and frequency demodulated via antenna 31 and demodulator 33. The output of demodulator 33, in this instance, will be scrambled delta modulated signal. Obviously such a signal is not ready for application to output audio means 35. In accordance with the present invention, the signal form detector 37 is provided to determine whether or not the output of the demodulator 33 is in the form of digital signal or analog signal. This is accomplished by the signal form detector 37 which determine that the output of demodulator 33 whether it is in the form of a digital signal or analog signal. Upon detection of the digital nature of the output of the demodulator, the signal form detector 37 will provide two outputs. One in the form of logical 1 output and apply it to the input A of the latch 54 and the other in the form of output which may be logical 0 and apply it to input $\overline{A}$ of the switch 47.

In short, upon detection of a digital signal, signal form detector 37 provides the binary signal of logical 1 to the input A of the latch 54 and an opposite or logical 0 to the input $\overline{A}$ of the switch 47. The switch 47 is disposed between the audio output 35 and the demodulator 33, and is subject to control by the output of the code detector. If the signal form detector 37 detects that the output of the demodulator is an analog signal audio, then the code detector outputs is 0 and 1 and applied to terminals A and $\overline{A}$. With $\overline{A}$ being 1, the switch 47 stays closed. The closed switch 47 will permit transmission of the audio signal from the output of the demodulator to the audio application means 35.

When signal form detector 37 detects that the output of the demodulator 33 a digital signal, the $\overline{A}$ output will change to logical 0 and the other output namely, A will change to logical 1. When $\overline{A}$ changes to logical 0, the switch 47 opens. This opens the path to audio output 35 from demodulator 33 via switch 47. Consequently, no direct application of the output of demodulator to the audio output means 35 is possible. As noted in FIG. 2, the signal form detector 37 is driven by the common clock 38. When output of the demodulator 33 is a scrambled delta modulated digital signal, the descrambler 39 descrambles it and provides a descrambled delta modulated signal to the detector 41. The descrambler output is in the form of a delta modulated digital signal, in other words, the output of the descrambler 39 is in the form of an digital signal. As illustrated in FIG. 2, the descrambler is driven by the common clock 38 in providing its descrambling function. For the detector 41, advantageously the delta modulated signal detector of the present invention, as described with reference to FIG. 3, can be utilized. The output of the descrambler is applied to the counter 51 and the counter 51 is driven by the common clock 38 via a timing circuit 55. The counter 51 provides its counting function of the transitions or the occurrences of the pulses found in the output of the descrambler 39. The decoder in turn will decode the pulse counts and apply logical 0 or logical 1 in its output. Now in response to the output from the decoder 53 and the signal form detector 37, latch 54 will operate and provide its output. As described hereinabove with reference to FIG. 3 in detail, the latch 54 will provide either logical 0 or logical 1 at its output C, in response to the changes in its two inputs A and B in the sequence, as indicated in the Status States I, II, III, IV and V. Restated the code detector output A provides initially logical 0 indicating that the incoming delta modulated signal is not yet detected. After, the signal form detector 37 detects the presence of a digital signal and provides a logical 1 to the latch 54 of the detector 41 the detector 41 changes its output C to logical 1, as shown in Status State III, if the input signal having energy spectrum in the acceptable frequency range, namely, above the predetermined high frequency of 4.5 kHz or below the predetermined lower frequency of 1.5 kHz, the detector 41 changes its output to logical 1, as shown in Status State III.

This causes the logical output of the detector 41 to apply logical 1 to the switch 45 via path 42. The switch 45 is of conventional design which will respond to logical signal 1 and close its path. This will provide a path from the output of the digital to analog converter 43 to the audio output 35. When this takes place, the output of the descrambler 39 will be allowed to be applied through the digital to analog converter 43 and transmitted to the audio output 35 via the switch 45. So long as the switch 45 stays closed, that is, as long as the output of the detector 41 remains in logical 1 state, the switch 45 will continue to provide path for the output of the digital to analog converter 43 so that it can be applied to the audio output 35.

Hereinabove a delta modulated signal detector of the present invention has been described. Also use of such a detector in a receiver that permits the detection of FM modulated analog signal or in the alternative, delta modulated digital signal, utilizing the detector of the present invention is a very advantageous manner. Advantageously with the present inventive delta modulated signal detector, a substantial simplification of code detector, as well as receiver, is made possible in that complex filter circuitry is no longer required. Moreover, the present delta modulated signal detector is essentially based on a common clock and a code detector; so it adjusts itself to any predetermined clock frequency that may be utilized to generate the delta modulated signal.

Advantageously, the delta modulated code detector of the present invention can be utilized to function as a proper code detector in a repeater or in a radio. This is done by having the output of the detector supplied to an input of the repeater or the radio. This is obtained because of the fact that the present delta modulated signal detector has the characteristics that permits the detector to detect initially the presence of incoming signal only when the signal has been properly decoded. The latch output which is reset by a code detector or a squelch can be used to squelch out any message which cannot be properly decoded. Stated in other words, so long as the decoder 53 does not change its logical output from logical 0 to logical 1, thereby signifying the detection of proper reception in incoming delta modulated code signal, the detector 41 will not provide a logical 1 in its output. In other words, the detector 41 will continue to provide logical 0 and this in turn will cause the logical 0 to be applied to the switch 45. So long as the logical 0 signal is applied to the switch 45, this will prevent the receiver from providing any audio output at the output terminal 35.

Advantageously because of the ability of the delta modulated signal detector of the present invention to detect signal in relatively noisy environment, the reception of incoming delta modulated signal is improved and can squelch out undecoded signals. This permits multi code and shared channel coded/clear systems applied of the decoder attractive. Advantageously also the present delta modulated signal detector provides a faster recognition time in detecting the delta modulated signal than those possible using the prior art delta modulated signal detectors that rely on the active or passing filters.

Various modifications and changes may be made to the present invention by those of ordinary skill in the art without departing from the spirit and the scope of the present invention.

I claim:

1. A detector for detecting a delta modulated signal comprising;

a timing circuit for providing a timing signal having a predetermined time interval, a counter responsive to the timing signal for counting the digital bit occurrences of the delta modulated signal within the predetermined time interval and providing a count signal giving the count of the digital bit occurrences of the delta modulated signal within the given time interval, a decoder responsive to the timing signal and receiving the count signal from the counter and providing a binary signal of a first state when a count signal indicates number of bit occurrences of the delta modulated signal above a predetermined high level of count or below a predetermined low level of low count and providing a binary signal of a second state when the count signal indicates the number of digital bit occurrences fall between the predetermined high level count and the low level count, a latch circuit responsive to the output of the decoder, and a code detect signal representing detection of a predetermined code signal, the latch circuit providing an output signal in response to the binary signal of the first state from the decoder and the code detect signal.

2. The detector according to claim 1, wherein said latch circuit adapted to receive the output of the decoder and a code detect signal representing detection of a pedetermined code signal and said latch circuit adapted to provide a binary output signal of first or second state in response to the inputs from the decoder and the detect signal as in the following table;

|   | I | II | III | IV | V |
|---|---|----|-----|----|---|
| A | 0 | 1  | 1   | 1  | 0 |
| B | 0 | 0  | 1   | 0  | 0 |
| C | 0 | 0  | 1   | 1  | 0 | wherein row A represents code detect signal wherein its absence is noted in the form of logical 0 and its presence in the form of logical 1 row B represents decoder output wherein its output is represented in logical 1 for the binary signal of the first state and logical 0 for the binary signal of the second state, and row C represents the output of the latch circuit wherein its output is in the form of logical 0 or 1 as indicated, when the two input from the decoder and code detect signal occur in sequence as indicated in Status States I, II, III, IV and V in response to the changes in which the two inputs A and B change their status.

3. A receiver for receiving a scrambled or unscrambled incoming digital data signal, comprising;

a clock signal source for providing a train of clock pulses at a rate substantially twice the rate of the highest frequency of the incoming digital data, a code detector responsive to the clock pulses and the incoming digital data for determining the characteristics of the data as to whether it is scrambled or unscrambled data and providing unscrambled signal detect signal and scrambled signal detect signal, first switch means responsive to the unscrambled signal detect signal for passing the incoming digital data to an output utilization means, descrambler responsive to the clock pulses for descrambling the incoming digital data detector responsive to the clock pulses and scrambled signal detect signal for providing descrambled digital data detect signal, and second switch means responsive to the descrambled digital data detect signal for passing the descrambled digital data to the output utilization means from the descrambler.

4. The receiver according to claim 3, wherein said detector includes a detector for detecting a delta modulated descrambled digital data signal, comprising;

a timing circuit responsive to the clock signal source for providing a timing signal having a predetermined time interval, a counter responsive to the timing signal for counting the digital bit occurrences of the delta modulated descrambled signal during the time interval and providing a count signal giving the count of the digital bit occurrences of the delta modulated descrambled signal within a given time period, and a decoder responsive to the timing signal and receiving the count signal from the counter and providing a binary signal of first state when a count signal indicates number of bit occurrences of the delta modulated signal above a predetermined high level of count or below a predetermined number of low counts and providing a binary signal of a second state when the count signal indicates the number of digital bit occurrences fall between the predetermined high level count and the low level count, and a latch circuit responsive to the output of the decoder and the code detector detecting the presence of scrambled digital data for providing an output signal in the presence of the binary signal of the first state from the decoder and the code detector output representing the presence of the scrambled data.

5. The receiver according to claim 3, wherein said detector includes a detector for detecting a delta modulated descrambled digital data signal, comprising;

a timing circuit responsive to the clock signal source for providing a timing signal having a predetermined time interval, a counter responsive to the timing signal for counting the digital bit occurrences of the delta modulated descrambled signal during the time interval and providing a count signal giving the count of the digital bit occurrences of the delta modulated descrambled signal within a given time period, and a decoder responsive to the timing signal and receiving the count signal from the counter and providing a binary signal of first state when a count signal indicates that number of bit occurrences of the delta modulated signal above a predetermined high level of count or below a predetermined number of low counts and providing a binary signal of a second state when the count signal indicates the number of digital bit occurrences fall between the predetermined high level count and the low level count, and a latch circuit adapted to receive the output of the decoder and a code detect signal representing detection of a predetermined code signal and said latch circuit adapted to provide a binary output signal of first or second state in response to the two inputs from the decoder and the detect signal as in the following table

|   | I | II | III | IV | V |
|---|---|----|-----|----|---|
| A | 0 | 1  | 1   | 1  | 0 |
| B | 0 | 0  | 1   | 0  | 0 |
| C | 0 | 0  | 1   | 1  | 0 | wherein row A represents code detect signal wherein its absence is noted in the form of logical 0 and its presence in the form of logical 1, row B represents decoder output wherein its output is represented in logical 1 for the binary signal of the first state and logical 0 for the binary signal of the second state, and Row C represents the output of the latch circuit wherein its output is in the form of logical 0 or 1 as indicated when the two binary input from the decoder and code detect signal occur and in the form of row C in response to the sequence as shown in columns I, II, III, IV, and V in which the two inputs A and B take place in sets in succession.

* * * * *